United States Patent [19]

Pollock

[11] Patent Number: 4,685,778

[45] Date of Patent: Aug. 11, 1987

[54] PROCESS FOR NUCLEAR HARDENING OPTICS AND PRODUCT PRODUCED THEREBY

[76] Inventor: David B. Pollock, 13026 Percivale Dr., Huntsville, Ala. 35803

[21] Appl. No.: 861,962

[22] Filed: May 12, 1986

[51] Int. Cl.$^4$ .................. G02B 5/08; G02B 23/24; B22D 11/126; B23P 15/26
[52] U.S. Cl. ...................................... 350/600; 29/558; 156/664; 350/320; 427/163; 427/307; 427/328
[58] Field of Search ................. 29/557, 558, 527.2; 350/320, 600, 642; 156/664, 666; 427/304, 307, 328, 163, 124

[56] References Cited

U.S. PATENT DOCUMENTS

| | | | |
|---|---|---|---|
| 4,069,110 | 1/1978 | Babaian | 156/664 X |
| 4,214,818 | 7/1980 | Choyke et al. | 350/320 X |
| 4,378,626 | 4/1983 | Eitel | 29/527.2 |
| 4,403,828 | 9/1983 | Davis et al. | 350/320 X |
| 4,406,045 | 9/1983 | Schwab | 29/527.2 |
| 4,457,587 | 7/1984 | Kalayama et al. | 350/600 X |
| 4,517,040 | 5/1985 | Whittel | 156/664 X |
| 4,647,158 | 3/1987 | Yeadon | 350/320 X |

FOREIGN PATENT DOCUMENTS 110203  8/1980  Japan ................................. 350/600

*Primary Examiner*—Charlie T. Moon
*Attorney, Agent, or Firm*—John C. Garvin, Jr.; Freddie M. Bush

[57] ABSTRACT

A process for nuclear hardening an optical part consisting of a prepared beryllium substrate processed to yield a surface finish of at least 125 micro-inch rms that is subsequently provided with a vapor deposited coating of beryllium of about 0.012 inch ±0.002 inch thick. The vapor deposited coating is precision finished to a low-scatter, first surface mirror on a beryllium substrate.

The disclosed process broadly comprises:

1. selecting a suitable substrate material of high purity beryllium;
2. matching to shape;
3. processing and annealing the machined part;
4. mild alkaline cleaning the machined part;
5. etching the machined part;
6. precision machining holes, threads, and lap precision surfaces;
7. cleaning all surfaces by vapor degreasing;
8. coating surfaces by vapor depositing beryllium;
9. thermally processing by immersing coated part in liquid nitrogen; and
10. grinding, polishing, and configuring to yield a low-scatter first surface mirror on a beryllium substrate.

2 Claims, No Drawings

PROCESS FOR NUCLEAR HARDENING OPTICS AND PRODUCT PRODUCED THEREBY

DEDICATORY CLAUSE

The invention described herein was made in the course of or under contract No. DAHC60-73-C-0087 or subcontract thereunder with the Government; therefore, the invention described herein may be manufactured, used and licensed by or for the Government for governmental purposes without the payment to me of any royalties thereon.

BACKGROUND OF THE INVENTION

High energy photons such as those emitted from an exoatmospheric nuclear burst can severely damage a conventional optical surface when exposed.

An optical surface, such as a mirror, if it is required to withstand exposure to highly energetic photons, must be processed by employing many scientific procedures which contribute to the required properties of the finished mirror. Failure of any phase of the individual process procedures could result in a product that is destined to failure when subjected to a harsh nuclear environment.

Therefore, an object of this invention is to provide a process for producing a first surface mirror which after being exposed to highly energetic photons remains smooth and functional for its intended use.

A further object of this invention is to provide a process for producing a strain-free, stable substrate for a coating that is processed to yield a highly efficient mirror.

Still a further object of this invention is to provide a process for producing a vapor deposited coating of high purity on a strain-free, stable substrate.

Thus, the consolidated objects of this invention are to provide the processing procedures and requirements for obtaining a dense, defect-free and adherent coating on a strain-free, stable substrate which supports the coating that is processed to an extremely smooth optical finish which functions as a highly efficient mirror.

SUMMARY OF THE INVENTION

A procedure is disclosed for making low scatter, x-ray hard mirrors which provide an optical surface which is dense, defect-free and capable of withstanding exposure to highly energetic photons.

The process steps of this invention comprise:
1. selecting a substrate of beryllium from either I-220 instrument grade, I-70 optical grade, or S-200 structural grade;
2. preparing the substrate by a machining technique which minimizes machine damage and residual stresses to yield a surface finish of 125 micro-inch rms or better;
3. processing-annealing by heating in a vacuum and cooling under controlled atmosphere conditions;
4. etching the surface to remove 0.002 to 0.003 inch of machined substrate;
5. completing precision machine holes, threads, and lap precision surfaces;
6. cleaning by vapor degreasing surfaces with a suitable solvent selected from reagent grade acetone, freon, or isopropanol;
7. completing physical vapor deposition of a 0.012±0.002 inch thick coating of beryllium on beryllium substrate;
8. thermally stabilizing the coated part by immersing in liquid nitrogen gas under controlled temperature and time cycles; and,
9. completing polishing and figuring procedure using low-scatter optical polishing procedures as for bare beryllium.

DESCRIPTION OF THE PREFERRED EMBODIMENT

Completing the process steps for producing nuclear hardened optics in accordance with this invention yields a dense, defect-free, adherent beryllium coating on a beryllium substrate. Subsequent polishing of the coated surface yields a low-scatter first surface mirror suitable for application use at temperatures from below 4K to greater than 300K in an environment of exposure to highly energetic photons.

The polished first surface mirror is a highly polished, vapor deposited beryllium coating on a precision prepared beryllium substrate.

The procedure outlined below describes the process steps, materials required, and lists special instructions relating to tolerances in parameters, special conditions, solvents, chemicals, cycle times, temperatures, pressure, and atmosphere conditions required to achieve the desired product, a nuclear hardened mirror.

Broadly, the process steps comprise:
1. selecting a suitable substrate material of high purity beryllium;
2. machining to shape;
3. processing and annealing the machined part;
4. etching the machined parts;
5. precision machining holes, threads, and lap precision surfaces;
6. cleaning all surfaces by vapor degreasing;
7. coating surfaces by vapor depositing beryllium;
8. thermally processing by immersing coated part in liquid nitrogen; and
9. grinding, polishing, and configuring to yield a low-scatter first surface mirror on a beryllium substrate.

The detailed process steps of this invention, in sequence, are as follows:

1. Selecting a substrate material of high purity beryllium, either:
  a. I-200 instrument grade;
  b. I-70 optical grade; or
  c. S-200 structural grade (Brush-Wellman designation is suitable).

2. Machining the part to shape using techniques which minimize machine damage and residual stresses.
  a. rough machine to within 0.05 inch of final dimensions;
  b. stress-relieve by heating the part to 650° C.±50° C. in a vacuum and maintain this temperature for four hours. (A cooling rate equal to or less than 100° C./hour above 300° C. is required. For cooling, a vacuum or dry nitrogen atmosphere is acceptable.);
  c. final machine to within 0.002 to 0.003 inch by successively removing 0.020, 0.020, 0.007 inch of stock. (A surface finish of 125 micro-inch rms or better is required.)

3. Processing and annealing the part by heating it to 800° C.±20° C. in a vacuum of $10^{-5}$ torr or less pressure, for a period of 2±0.25 hours. The cooling rate should be less than 100° C/hour above 300° C. Below 300° C. a vacuum, air or dry nitrogen atmosphere is acceptable.

4. Etching the part all over to remove 0.002 to 0.003 inch stock.
   a. vapor degrease using 1,1,1 trichloroethane;
   b. mild alkaline clean by immersion (Turco 4215, $7\pm2$ oz/gal in deionized water);
   c. deionized water rinse;
   d. etch in a nitric, sulfuric, hydrofluoric acid solution (solution is 2% nitric acid, 2% sulfuric acid, and $1\frac{1}{2}$% hydrofluoric acid in deionized water);
   e. deionized water rinse;
   f. dry in clean dry air.

5. Precision machining holes, threads and lap precision surfaces. Up to 0.005 inch stock-removal is acceptable.

6. Cleaning by vapor degreasing and subsequently by wiping. Use reagent grade acetone, freon or isopropanol without puddling and blow dry.

7. Note: storage of this precision substrate part is acceptable by wrapping the part to preclude contamination buildup.

8. Physical vapor deposit a $0.012\pm0.002$ inch thick coating on the optical surface:
   a. heat the substrate to $250°$ C.$\pm25°$ C. while maintaining the pressure at or below $10^{-4}$;
   b. when the pressure has decreased to $10^{-5}$ torr, heat the part to $520°$ C.$\pm25°$ C. and maintain this temperature until the pressure remains below $10^{-5}$ torr;
   c. sputter etch the part at a greater than 3 watt-hours per in$^2$ of surface area with an argon gas pressure of $10^{-3}$ to $10^{-4}$ torr;
   d. heat the substrate to $420°$ C.$\pm20°$ C.;
   e. initiate substrate rotation, 1–20 rpm, as necessary to realize a 10% thickness uniformity;
   f. the material deposition rate is $12\pm10\times10^{-5}$ in/min
   g. cool at a rate of $100°$ C./hour or less above $300°$ C. in a vacuum or dry nitrogen atmosphere.

9. Thermal process the coated part by immersing it in liquid nitrogen gas (LN$_2$) at $-190°$ C.$\pm20°$ C. for a minimum of 30 minutes and then allowing the part to warm to $95°$ C. in warmed, dry air for 15 minutes minimum. Minimum times are for the part at temperature. Three complete warm-cold-warm cycles are required.

10. The coated optical surface of the finished part is ground, polished and figured. Use conventional low-scatter optical polishing procedures as for bare beryllium.

The above process steps include: (i) selecting a substrate material of a high purity beryllium; (ii) completing a machining process to minimize machine damages and residual stresses; (iii) completing an annealing process to produce a stable substrate surface; (iv) completing a degreasing, cleaning, and etching process; and (v) completing a physical vapor depositing procedure to yield a coated substrate which is further processed to yield a highly efficient mirror.

Alternately, if the system requirements do not dictate the need of the highly efficient mirror produced by the complete process of this invention including the coated substrate, then the substrate itself may be further processed to produce a mirror of less efficiency by using lowscatter optical polishing procedures as for bare beryllium.

Brush-Wellman, Inc. is well established as the western world's largest producer of beryllium. Recent information is that processing of the raw material is completed at the company's Delta, Utah, mill and refinement of the metal will be in Elmore, Ohio. The high stiffness material has about $\frac{2}{3}$ the density of aluminum and is used for satellite truss structure and optical structures such as the thematic mapper remote land sensor. As the primary supplier of beryllium, the Brush-Wellman designations have been accepted as the reference for beryllium metal, its alloys, and as combined with ceramics.

I claim:

1. A process for nuclear hardening an optical part consisting of a prepared beryllium substrate processed by the procedures and processes defined under A through D set forth below, said substrate serving as a support for a vapor deposited beryllium coating processed by the procedures and precision processes defined under E set forth below to yield a first surface mirror which is dense, defect-free, and capable of withstanding exposure to highly energetic photons, said process comprising:

A. selecting a subtrate material of high purity beryllium from a grade of high purity beryllium selected from instrument grade, optical grade, or structural grade or the equivalent grade of beryllium having a Brush-Wellman designation, said high purity beryllium functioning as a substrate for a vapor deposited coating of beryllium after being machined and finished to a surface finish of 125 micro-inch rms;

B. Machining said substrate material by a machining process to minimize machine damage and residual stresses, said machining process comprising:
      a. rough machining said substrate material to within 0.05 inch of final dimensions;
      b. stress relieving said machined substrate material by heating to a temperature of about $650°$ C.$\pm50°$ C. in a vacuum and maintaining said temperature for about four hours;
      c. cooling said substrate material at a rate equal to or less than about $100°$ C. per hour above $300°$ C., said cooling performed in a vacuum or dry-nitrogen atmosphere;
      d. completing a final machining of said substrate material to within 0.002 inch to 0.003 inch by successively removing layers of 0.020 inch, 0.020 inch, and 0.007 inch from said substrate material to perfect a surface finish of 125 micro-inch rms or better;

c. Processing and annealing said final machined substrate material by first heating to about $800°$ C.$+20°$ C. in a vacuum of $10^{-5}$ torr or less pressure for a time period of about two hours$\pm0.25$ hour and then cooling at a rate of less than about $100°$ C. per hour above $300°$ C. temperature followed by cooling below $300°$ C. in a vacuum, air or dry nitrogen atmosphere;

D. Completing a degreasing, cleaning and etching process on said final machined substrate material which comprises:
      a. vapor degreasing with 1,1,1 trichloroethane;
      b. mild alkaline cleaning and rinsing by first immersing in a mild alkaline solution prepared by adding 7 $\pm2$ oz of a mild alkaline cleaning compound per gallon of deionized water followed by rinsing in deionized water;
      c. etching in a nitric acid, sulfuric acid, and hydrofluoric acid solution containing by volume 2% nitric acid, 2% sulfuric and $1\frac{1}{2}$% hydrofluoric in deionized water followed by rinsing in deionized water and drying in clean dry air;

d. completing precision machining of holes, threads and lap precision surfaces by removing up to about 0.005 inch of stock; and
e. cleaning by vapor degreasing and subsequently wiping of surfaces using reagent grade acetone, freon, or isopropanol and blow drying;

E. Completing a physical vapor depositing procedure to yield a coating of about 0.012 inch±0.002 inch thick of beryllium on said substrate material processed as defined under A through D set forth hereinabove, said physical vapor depositing procedure comprising:
   a. heating said prepared substrate material to 250° C.±25° C. while maintaining a pressure at or below about $10^{-4}$ torr;
   b. continue heating said prepared substrate material until pressure has decreased to $10^{-5}$ torr and then continue heating said prepared substrate material to a temperature of about 520° C.±25° C. and maintaining this temperature until the pressure remains below $10^{-5}$ torr;
   c. sputter etching said prepared substrate material of a power level greater than three watt-hours per square inch of surface area with an argon gas pressure of $10^{-3}$ to $10^{31\ 4}$ torr;
   d. heating said sputter etched substrate to 420° C.±20° C. and then initiate substrate rotation from about one to about 20 revolutions per minute as required to achieve a 10% thickness uniformity during a vapor deposition rate of beryllium controlled at a deposition rate of about $12\pm10\times10^{-5}$ inches per minute;
   e. cooling said vapor deposited coating and said prepared substrate material at a rate of about 100° C. per hour until 300° C. is reached and then complete cooling in a vacuum or dry nitrogen atmosphere;
   f. thermally processing the coated, prepared substrate by immersing it in liquid nitrogen gas at $-190°$ C.±20° C. for a minimum time of about 30 minutes and then allowing the coated, prepared substrate to warm to about 95° C. in warmed, dried air for about 15 minutes minimum;
   g. repeating said thermal processing to complete three complete warm-cold-warm cycles; and,
   h. completing a grinding, and polishing procedure using low-scatter optical polishing procedures as for bare beryllium to complete said process for nuclear hardening an optical part consisting of a first surface mirror of beryllium on a prepared substrate of beryllium, said first surface mirror being dense, defect-free, and capable of withstanding exposure to highly energetic photons.

2. A nuclear hardened optical part in the form of lows-catter, first surface mirror on a prepared substrate of beryllium, said prepared substrate surface having a surface finish of at least 125 micro-inch rms prepared by the process defined by the steps A through D of claim 1 prior to receiving a vapor deposited coating of about 0.012 inch ±0.002 inch thick of beryllium completed by vapor depositing, thermally processing, grinding, and polishing by the process defined by the steps of E of claim 1.

* * * * *